(12) United States Patent
Heidari

(10) Patent No.: US 7,041,228 B2
(45) Date of Patent: May 9, 2006

(54) SUBSTRATE FOR AND A PROCESS IN CONNECTION WITH THE PRODUCT OF STRUCTURES

(75) Inventor: Babak Heidari, Furulund (SE)

(73) Assignee: Obducat Aktiebolag, Malmo (SE)

( * ) Notice: Subject to any disclaimer, the term of this patent is extended or adjusted under 35 U.S.C. 154(b) by 177 days.

(21) Appl. No.: 10/258,027

(22) PCT Filed: Apr. 10, 2001

(86) PCT No.: PCT/SE01/00788

§ 371 (c)(1),
(2), (4) Date: Jan. 21, 2003

(87) PCT Pub. No.: WO01/79933

PCT Pub. Date: Oct. 25, 2001

(65) Prior Publication Data

US 2004/0005444 A1    Jan. 8, 2004

(30) Foreign Application Priority Data

Apr. 18, 2000 (SE) .................................. 0001430

(51) Int. Cl.
*B44C 1/22* (2006.01)

(52) U.S. Cl. ................. 216/40; 216/44; 430/312; 430/313; 430/314

(58) Field of Classification Search ............... 216/47, 216/40, 41, 44, 48, 54; 438/738, 739, 736, 438/15; 264/239, 240, 241, 251, 259, 260, 264/293, 299, 330, 331.11
See application file for complete search history.

(56) References Cited

U.S. PATENT DOCUMENTS 3,873,361 A *  3/1975 Franco et al. ............... 430/324
4,533,624 A *  8/1985 Sheppard .................... 430/312
5,725,788 A    3/1998 Maracas et al.

(Continued)

FOREIGN PATENT DOCUMENTS

SE           515 607         9/2001

(Continued)

OTHER PUBLICATIONS

Chou et al., "Sub-10 nm imprint lithography and applications," J. Vac. Sci. TEchnol. B., vol. 15, No. 6, Nov./Dec. 1997, pp. 2897-2904.

(Continued)

*Primary Examiner*—Parviz Hassanzadeh
*Assistant Examiner*—Roberts Culbert
(74) *Attorney, Agent, or Firm*—Birch, Stewart, Kolasch & Birch, LLP

(57) ABSTRACT

A substrate comprising at least a first and a second coating layer on one surface of the substrate is for nanoimprint lithography, the first coating layer has a positive resist and the second coating layer has a negative resist. A process in connection with nanoimprint lithography on the substrate impresses a pattern of nanometer size in a first stage into the second coating layer by a template, following which the first coating layer, in a second stage, is exposed to a chiefly isotropic developing method on surfaces thereof that have been exposed in connection with the first stage, a method for developing and material for the first and second coating layers being selected so that the first coating layer is developed more quickly than the second coating layer, so that an undercut profile is obtained in the coating layers.

11 Claims, 6 Drawing Sheets

U.S. PATENT DOCUMENTS

| | | | |
|---|---|---|---|
| 5,772,905 A | | 6/1998 | Chou |
| 5,925,259 A | | 7/1999 | Biebuyck et al. |
| 5,947,027 A | * | 9/1999 | Burgin et al. ............... 101/474 |
| 6,309,580 B1 | * | 10/2001 | Chou ......................... 264/338 |
| 6,334,960 B1 | * | 1/2002 | Willson et al. ............... 216/52 |

FOREIGN PATENT DOCUMENTS

WO     WO 01/42858 A1     6/2001

OTHER PUBLICATIONS

Chou et al., "Nanoimprint lithography," J. Vac. Sci. Technol. B, vol. 14, No. 6, Nov./Dec. 1996, pp. 4129-4133.

Cui et al., "Perpendicular quantized magnetic disks with 45 Gbits on a 4×4 cm2 area," Journal of Applied Physics, vol. 85, No. 8, Apr. 15, 1999, pp. 5534-5536.

Schulz et al., "New polymer materials for nanoimprinting," J. Vac. Sci. Technol. B., vol. 18, No. 4, Jul./Aug. 2000, pp. 1861-1865.

Sun et al., "Multilayer resist methods for nanoimprint lithography on nonflat surfaces," J. Vac. Sci. Technol. B, vol. 16, No. 6, Nov./Dec. 1998, pp. 3922-3925.

* cited by examiner

SUBSTRATE FOR AND A PROCESS IN CONNECTION WITH THE PRODUCT OF STRUCTURES

This application is the national phase under 35 U.S.C. § 371 of PCT International Application No. PCT/SE01/00738 which has an International filing date of Apr. 10, 2001, which designated the United States of America.

1. Technical Field

The present invention relates to a substrate including at least a first and a second coating layer on one surface of the substrate, for nanoimprint lithography.

The invention also relates to a process in connection with the lithography of structures of nanometer size on a coated substrate. The invention is applicable in connection with nanoimprint lithography on semiconductor materials, such as silicon, indium phosphide or gallium arsenide, for the production of semiconductor components, but also in connection with nanoimprint lithography on other rigid materials, such as ceramic materials, metals or polymers with a relatively high glass transition temperature, for use in e.g. biosensors.

2. Prior Art

The trend in microelectronics is towards ever smaller dimensions. In principle, development has been such that the dimensions are halving every third year. Commercial components are being manufactured today with structures of roughly 200 nm in size, but there is a need to go even further down in dimensions, to <100 nm. Research concerning components based on quantum effects is now highly topical and a demand is being created for a commercially applicable manufacturing technique for components with dimensions <10 nm. These nanocomponents can be produced currently using serial technology in individual specimens, for research purposes, but for mass production a parallel production method is required. One such parallel production method that has been developed in recent times is nanoimprint lithography (NIL), U.S. Pat. No. 5,772,905, which has set out the basic preconditions for the mass production of structures close to atomic scale, see Stephen Y. Chou, Peter R. Krauss, Wei Zhang, Lingjie Guo and Lei Zhuang: "*Sub-10nm imprint lithography and application*", *J. Vac. Sci. Technol. B, Vol* 15, *No* 6 (1997).

The basic principle of NIL is mechanical deformation of a thin film layer, which is coated onto a flat plate of silicon. The NIL process can be compared with the production process for CDs and can be described in three stages:

1. Production of template: A template can be produced from various materials, e.g. metal, semiconductor, ceramic or from certain plastics. To create a three-dimensional structure on one surface of the template, various lithographic methods can be used, depending on the requirements for the size of the structures and their resolution. E-beam and X-ray lithography are normally used for structure dimensions that are less than 300 nm. Direct laser exposure and UV lithography are used for larger structures.
2. Imprint: A thin layer of a polymer, e.g. polyamide, is applied to a flat substrate of silicon. The layer is heated and at a certain temperature, the so-called imprint temperature, the predefined template and substrate are pressed together, the inverse of the template's structure being transferred in the polymer layer to the substrate.
3. Structure transfer: In the areas pressed together in the polymer layer, a thin layer of polymer remains. The last stage is removal of this thin remaining layer on the substrate. This is carried out in a so-called "RIE" or O2 plasma unit. The thinner this remaining layer is, the finer the structures that can be created using the nanoimprint process.

Several research reports have been presented on the subject, but until quite recently the method has been restricted to nanoimprinting of components with a small total area, typically only a few square centimeters, see Stephen Y. Chou, Peter R. Krauss and Preston J. Renstorm: "*Nanoimprint lithography*", *J. Vac. Sci. Technol. B*, 14, 4129 (1996); K. Pfeiffer, G. Bleidiessel, G. Gruetzner, H. Schulz, S. Hoffmann, H. -C. Scheer, C. M. Sotomayor Torres and J. Ahopelto: "*Suitability of new polymer materials with adjustable glass temperature for nanoiniprinting*", *Proceeding of Micro-and Nano-Engineering Conference*, (1998); and Leuven. Bo Cui, Wei Wu, Linshu Kong, Xiaoyun Sun and Stephen Y. Chou: "*Perpendicular quantized magnetic disks with* 45 *Gbits on a* 4×4 $cm^2$ *area*", *J. Appl. Phys.* 85, 5534 (1999).

One problem in connection with the NIL process is that there are structural variations in the material in the surface of a flat plate, or in other words there is, on a nanometer scale, an irregularity in the surface of each plate (template and substrate) even if the plates are polished. These irregularities result in an undesirable uneven distribution of force over the surfaces when the template and substrate are pressed together, which in turn leads to an unevenly embedded structure on the substrate. This is particularly critical for the imprinting process if the plates are large, e.g. if the size of the surfaces is more than 50 mm in diameter.

In X. Sun et al., "*Multilayer resist methods for nanoimprint lithography on nonflat surfaces*", *J. Vac. Sci. Technol. B* 16(6), November/December 1998, a method is presented for circumventing the problems of non-flat surfaces of substrates. The method starts out from providing the substrate with a planarising layer with a thickness of around 250–300 nm. This planarising layer can consist e.g. of polymethyl methacrylate (PMMA) or modified novolak resin. On top of the planarising layer, the substrate is provided with one or two further layers. The uppermost layer here is the imprint layer, and an optional intermediate layer forms a mask for the lowest layer (the planarising layer). According to the article, an imprint is produced in which the side walls of the structures are vertical. It is further stated that the method will probably be applicable for producing structures in the order of magnitude of 10 nm, even if this is not shown. One problem that is not mentioned in this regard, however, is that it is not possible to achieve intervals (periods) between the structural parts that are of as small a size as the structural parts themselves using the method described. This is due to the fact that relatively large total layer thicknesses are required for the planarising to be achieved. When forming structures in these thick layers, each part structure must have a base width that is considerably greater than the structure's dimensions at the surface of the top coating layer, if the structural part is not to be broken off. Due to this, the periods between the individual structures are considerably larger than the dimensions of the structures at the upper surface.

In SE-AO-9904517-1, an entirely new approach to the manufacture of structures of nanometer size by means of NIL is presented, which permits mass production of structures of nanometer size on large surfaces and thereby opens up entirely new possibilities for the design of more compact circuits and sensors for various applications with considerably greater sensitivity than those of today. The concept according to SE-AO 9904517-1 involves using an imprinting device that gives an absolutely even distribution of force over the entire surfaces that are to be pressed together during the imprint stage, while at the same time providing a large tolerance for any irregularities in the substrate. Due to this, no actual planarising of the substrate is required beyond conventional polishing.

A further aspect that must be taken into account in connection with the imprinting process is the subsequent metallization of the substrate and the removal following this, the so-called "lift-off", of the coating layer. After a completed imprinting process, the substrate has exposed surfaces between the individual structures in the coating layer/layers. On metallization, a thin metal layer is vaporized over both the exposed surfaces on the substrate and on the remaining structures in the coating layer/layers. The coating layer/layers, including the metal thereon, is then removed, e.g. by dissolving the bottom coating layer, the "lift-off layer" in e.g. acetone, only metal that is lying directly on the substrate remaining on the same. However, the lowest coating layer must have some free surface where the acetone can reach to begin to dissolve it. The periods between the structures in the coating layer/layers should therefore have a profile that is narrower at the upper surface of the uppermost coating layer and wider at the contact with the substrate (termed an undercut profile below). In the case of such a profile, the metallization layer will not be deposited on the inner part of the periods, i.e. on the walls of the structure parts, due to which these are exposed for dissolving by acetone or the like. However, such profiles are impossible to create directly when the template is pressed down into the coating layer of the substrate.

Further aspects to be taken into account are the cost and time aspects. If the NIL process is to be able to make a commercial breakthrough, it is a major disadvantage if complicated apparatus such as reactive ion etching (RIE) has to be used, as this apparatus is extremely expensive to purchase. RIE can also cause damage to the crystal structure of the substrate, as RIE typically produces ionising energy of 200–800 eV, while only a few eV are required to displace an atom. In spite of these disadvantages, RIE is often used today, due to the fact that cheaper methods such as chemical etching (plasma etching or chemical gas etching) are not viewed as giving adequate anisotropy. Anisotropy is taken to mean that the etching is directed, i.e. that it acts mainly in one direction (normally vertically) and only slightly in a direction at right angles to this (normally horizontally).

The time aspect means that certain etching/developing methods are hard to use since they work very quickly. In these cases, a developing time that is only a few seconds too long can result in developing that is too strong. In other cases again, the developing can take too long, which is unacceptable in a commercial context.

DESCRIPTION OF THE INVENTION

The object of the present invention is to present a coated substrate and a process for nanoimprinting of such a coated substrate, by which the above problem complex is eliminated or minimized.

A coated substrate and a process for nanoimprinting of such a coated substrate are thus presented according to the invention, according to the claims.

The invention is based on using at least two relatively thin coating layers on one side of the substrate. These two layers have essentially different material properties with regard to e.g. glass transition temperature, the possibility of cross-linking due to the influence of heat or irradiation, etching rate in different media or processes etc. After imprinting in the upper of the two layers, the lower layer is "developed" using a chiefly isotropic developing method that is selected so that it does not affect the upper layer at all, or affects it only to a lesser extent. Thanks to the isotropic developing method and its minimal effect on the uppermost layer, an undercut profile is produced in the nanostructure. Isotropic developing method in this regard is taken to mean a developing method that works in principle equally in all directions, in contrast to a directed developing method that works principally in one direction. Isotropic developing methods that can be used in this context consist of relatively very inexpensive chemical etching methods, such as plasma etching or chemical gas etching, or inexpensive wet methods such as a developing bath containing sodium hydroxide, electrochemical etching or traditional film developing. An example of a directed method is the extremely expensive $O_2$ RIE process (reactive ion etching).

According to one aspect of the invention, one coating layer, preferably the lower one, consists of a so-called positive resist, while the second coating layer, preferably the upper one, consists of a so-called negative resist. A negative resist is defined in that the polymer resist material is cross-linked on exposure to heat or irradiation, following which non-exposed parts can be removed by means of a developing process, normally a developing bath of various types depending on the resist type. A positive resist is defined in that the polymer resist material cannot be cross-linked, but on the other hand parts that are exposed to radiation can be removed by means of a developing process, normally a developing bath. A negative resist normally has a lower glass transition temperature ($T_g$=0–60° C.) compared with a positive resist ($T_g$=80–130° C.).

According to another aspect of the invention, the upper coating layer has a thickness of 20–500 nm, preferably 20–200 nm and even more preferredly 30–150 nm, while the lower coating layer has a thickness of 10–400 nm, preferably 20–200 nm and even more preferredly 30–150 nm. At the same time, it should hold good that the upper coating layer is at least as thick as, or thicker than, the lower coating layer. The lower coating layer thus does not have the function of acting as a planarising layer. What is most important, however, is that the upper layer is at least as thick as the structure depth in the template that is used for the imprint stage.

According to yet another aspect of the invention, the positive resist can consist of e.g. a material that is sold by Shipley under the name Shipley 1800 and which can best be developed by means of a developing bath comprising sodium hydroxide or tetramethyl ammonium hydroxide. Alternatively, PMMA can be used for example, which is best developed by means of a developing bath comprising isobutyl methyl ketone, or a material that is sold by Nippon Zeon Co., Ltd., under the name ZEP-520. According to a preferred embodiment of the invention, the positive resist in the impression from the template is exposed to radiation, which means that the developing time is shortened considerably at the same time as a more favourable profile is obtained for the walls. This favourable profile is undercut without the positive resist being developed too deeply in a horizontal direction (i.e. not too isotropically). The time for developing following exposure can be from approx. 10 seconds up to one minute, compared to several hours for a non-exposed positive resist. The type of radiation selected and the wavelength selected for the radiation depend on the type of positive resist that is used. The types of radiation can be X-ray radiation, electron radiation, ion radiation or UV radiation, for example. UV radiation is most preferred and can have wavelengths of 300–420 nm, or 100–300 nm if it is DUV (deep UV). The type of developing for the positive resist consists preferably of an isotropic developing method, which will however act to produce a more favourable profile when the positive resist is exposed prior to developing. The preferred developing methods are chemical etching methods, such as plasma etching or chemical gas etching or inexpensive wet methods such as a developing bath, electrochemical etching or traditional film developing.

According to yet another aspect of the invention, the negative resist consists preferably of a material that comprises a modified aromatic polymethyl methacrylate or a modified aromatic allyl polymer. Alternatively, the negative resist consists of a known negative resist, e.g. a negative resist that is sold by Olin-Hount under the name SC100, by Shipley under the name SAL, by Micro Resist Technology GmbH under the name SU8, or by Micro Resist Technology GmbH under the name PGMA The negative resist is developed preferably isotropically by means of plasma etching, but chemical gas etching or wet methods can also be used. In the preferred embodiment, the negative resist is exposed at the same time as the positive resist is exposed to radiation, meaning that the negative resist is cross-linked. Due to this, the negative resist will be influenced to an extremely small extent when the positive resist is developed. In embodiments also where radiation is not used, the negative resist can be cross-linked in this positive manner, primarily due to the heat treatment to which the material is exposed in the actual imprint stage.

The imprint stage is executed at an elevated temperature, the so-called imprint temperature, which lies above the glass transition temperature ($T_g$) for the negative resist. The imprint temperature is preferably at a level of 100° C. maximum, and is at least 20° C. higher than $T_g$ for the negative resist. At the same time, the imprint temperature should be less than or equal to $T_g$ for the positive resist.

According to another aspect of the invention, an intermediate layer, a so-called mask, is also used between the upper and the lower resist layer. The mask layer can best consist of a material that is influenced only slightly or not at all by a selected developing method, e.g. plasma etching, for the uppermost resist layer. The mask layer can here consist of a semiconductor material, e.g. $SiO_2$, or a metal, e.g. aluminium, chromium, gold or tungsten, that has good adhesion to both resist layers. The thickness of the intermediate layer can best be in the order of 10–40 nm, preferably 10–25 nm. According to a conceivable embodiment, the intermediate layer can be excluded, either in the case that irradiation is not used or if the uppermost layer is formed of a material that does not let the selected type of radiation through in the main.

According to yet another aspect of the invention, the actual imprint stage in the NIL process is executed in a device of the type that is shown in SE-AO-9904517-1, meaning that nanostructures can be produced on large surfaces, larger than 7–20 cm², in coating layers with relatively small thicknesses, without further measures being required for planarising of the substrate.

According to a further aspect of the invention, the substrate has an uppermost coating layer that has a thickness of around 10–30 nm and forms a non-stick coating to prevent said second coating layer from sticking to the template, partly or in large areas. The non-stick layer consists preferably of modified PMMA (PPM), and has a glass transition temperature that is higher than a glass transition temperature for the second coating layer. On imprinting at temperatures that are lower than the glass transition temperature for the non-stick layer, the non-stick layer will be punctured by a mechanical force but not deformed, since the layer is thin and soft but not molten. In the description of the drawings below, the non-stick layer has not been shown, so as not to confuse the principle for the first and second coating layers according to the invention. One alternative to using an uppermost, non-stick layer on the substrate is to use instead a non-stick layer on the template, e.g. of the teflon type.

The substrate and the process according to the invention have at least the advantages that they facilitate NIL with extremely small structural details, less than 100 nm, less than 50 nm or even less than 10 nm, with periods between them of equally small dimensions. The total thickness of the coating layers on the substrate is also advantageously thin, it being possible nevertheless to produce structures over large surfaces, i.e. total surfaces that are greater than approx. 7–20 cm². At the same time, an undercut profile of the structures is achieved, which according to the above facilitates effective removal of the lift-off layer following metallization of the substrate. A further advantage is that inexpensive and simple equipment can be used in connection with the NIL process.

DESCRIPTION OF DRAWINGS

The invention will be described below in greater detail with reference to the drawings, of which:

According to the above problem description, it is important for an undercut profile to be produced in the coating layer/layers on the substrate. FIG. 1a shows a substrate that has been coated with a coating layer 2 (a resist) according to the prior art. A pattern of nanometer size has been obtained in the resist 2 by means of NIL, a nanometer-size impression 3 in the resist 2 being shown symbolically in the drawing. The template (not shown) can only produce straight (i.e. vertical) walls in the impression 3, or slightly inclined walls 4, in the best case in this regard. In the bottom of the impression 3, a thin layer of resist 5 remains. FIG. 1*b* shows the substrate after this thin remaining layer of resist 5 has been removed (developed) in the impression, e.g. by means of plasma etching, so that the substrate 1 has been exposed in the impression 3. The resist thickness has also otherwise been reduced in connection with the removal of the remaining layer 5 in the impression 3, and the walls 4 have possibly become even more inclined and somewhat rounded at the top.

Figure 1A:
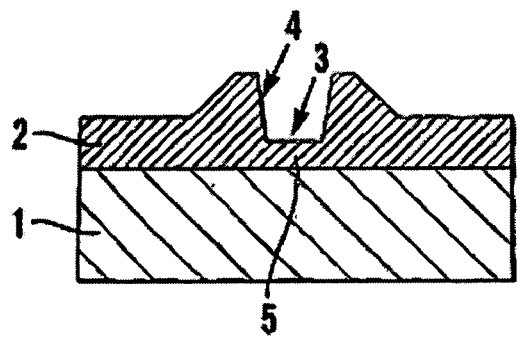
FIG. 1a shows a coated substrate according to the prior art, the coating layer being provided with an impression of nanometer size.
Figure 1B:
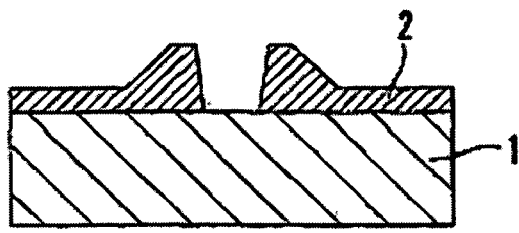
FIG. 1b shows the substrate in FIG. 1a following removal of a thin remaining layer of the coating layer in the impression.
Figure 1C:
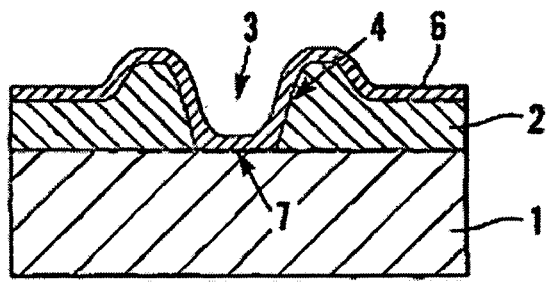
FIG. 1c shows the substrate in FIG. 1b, which has been coated with a metallizing layer.

When a metallizing layer 6, e.g. of chromium, is vaporized onto remaining parts of the resist 2 and the exposed part 7 of the substrate 1 in the impression 3, it will settle the whole way over the exposed part 7 of the substrate, over the inclined walls 4 and also over the remaining parts of the resist. This causes problems for a subsequent "lift-off" process, i.e. a process in which the resist is dissolved in a developing bath (e.g. of acetone) so that the parts of the metallizing layer 6 that lie above remaining parts of the resist come loose and fall off. The aim of the lift-off process is that metal 6 shall only remain in the positions 7 where the metal lies directly on the substrate. If the metallizing layer 6 lies over the walls 4, the developing bath cannot reach the resist 2 to dissolve same, however, in which case the lift-off process is made considerably more difficult or becomes impossible.

Figure 2:
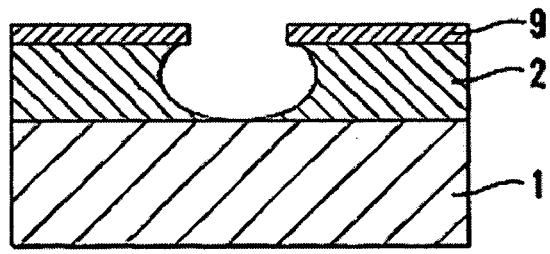
FIG. 2 shows an imprinted substrate on which a non-exposed, lower positive resist has been developed isotropically.

FIG. 2 shows a problem that can occur with a substrate 1 that has been coated with a lower resist 2, which consists of a positive resist, and a metal layer 9 lying on top of this in which a hole after an impression (not shown) has been etched out. If the positive resist is not exposed to radiation and an isotropic developing method, such as plasma etching, is used, developing proceeds very slowly (e.g. 0.1–2 nm/s) and the result is an unfavourable profile with strongly hollowed-out walls in the positive resist. Here also there is thus a risk that the metal, on subsequent metallization, settles up on the walls of the resist 2, the metal on the actual substrate 1 also risking coming loose in the lift-off process.

Figure 3:
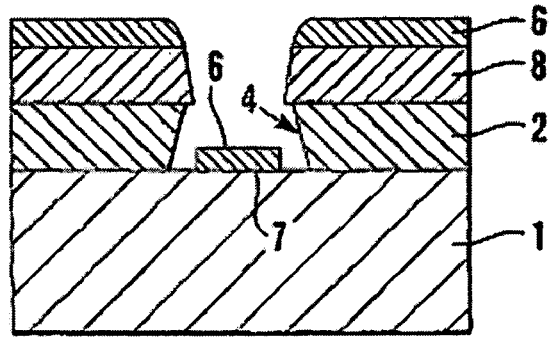
FIG. 3 shows a coated, nanoimprinted substrate according to the invention, which has been coated with a metallizing layer.

FIG. 3 shows a coated substrate according to the invention, the construction of which will be described in greater detail below. The coating layers (resist) 2, 8 have been provided by means of the process according to the invention with an impression 3 with a favourable undercut profile. The walls 4 in the impression here have a profile that is narrower at the upper surface of the uppermost coating layer 8 and wider at the contact with the substrate 1. When the metallizing layer 6 is put on, it will not therefore settle on the walls 4, but only on top of remaining parts of the resist 8 and on the exposed surface 7 of the substrate. Due to this, the walls 4 are advantageously exposed for the encroachment of the developing liquid in a subsequent lift-off stage.

Figure 4A:
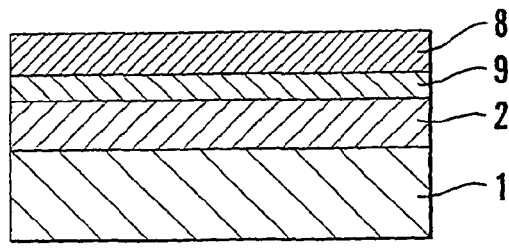
FIGS. 4a–e show a coated substrate according to a first embodiment of the invention and the stages for NIL of the same.

FIG. 4*a* shows an example of a coated substrate 1 according to a first, preferred embodiment of the invention. This substrate 1 has a first coating layer 2, which is arranged in direct contact with one surface of the substrate and has a layer thickness of around 60–100 nm. The first coating layer 2 consists of a positive photoresist, e.g. Shipley 1800. On application of the first coating layer 2, the resist material has been diluted using a thinner and spun onto the substrate at 6000 rpm for 30 seconds. Following this, the substrate 1 with the layer 2 has been heat-treated (baked) at 110° C. for one minute.

The first coating layer forms a protection for the substrate and a lift-off layer, but is however too thin to form a planarising layer for the substrate. According to a preferred embodiment of the invention, no actual planarising layer is required either, since a device (FIG. 7) and a method are preferably used for the imprint stage that mean that even imprinting can be obtained even on a substrate that is not entirely flat.

Arranged in direct contact with the first coating layer 2 is an intermediate layer 9 of a semiconductor material or a metal, e.g. $SiO_2$, aluminium or chromium, which has a layer thickness of around 20 nm. This intermediate layer 9 consists in the example of an aluminium layer that has been applied by means of vaporization under negative pressure (e.g. $10^{-6}$ mbar).

Arranged on top, in direct contact with the intermediate layer 9, is a second coating layer 8, which has a layer thickness of around 50–200 nm, it being true at the same time that the layer thickness for the second layer 8 is greater than the layer thickness for the first layer 2. The second coating layer 8 consists of a negative photoresist, e.g. SC100. On application of the second coating layer 8, the resist material has been diluted using a thinner and spun onto the substrate at 6000 rpm for 30 seconds. The substrate 1 with the layers 2 and 8 has then been heat-treated (baked) at 110–140° C. for one minute.

In certain cases (not shown) a non-stick layer, e.g. of PPM can be arranged on the second layer 8, which non-stick layer is applied by being spun on at 6000 rpm for 30 seconds to a thickness of 10–30 nm. The non-stick layer has lower adhesion to the template (detail no. 610 in FIG. 7) than to the second layer 8.

Figure 4B:
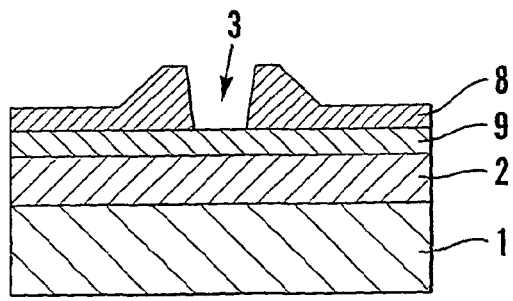

FIG. 4*b* shows the coated substrate following nanoimprinting at an imprint temperature below 100° C., e.g. 70° C., and a pressure of around 10–100 bar, in the second coating layer 8 (the negatives resist) and after a thin remaining layer of negative resist in the impression 3 has been removed by means of plasma etching for 10–20 seconds. The intermediate layer 9 here forms the mask for the first coating layer 2 (the positive resist). The first coating layer 2 has a higher glass transition temperature ($T_g$=85° C.) than the second coating layer 8 ($T_g$=35–55° C.), meaning that only the second coating layer is in a molten state in the nanoimprint stage, but not the first.

Figure 4C:
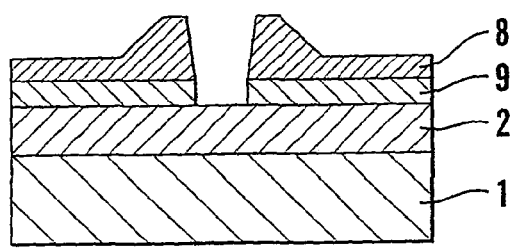
Figure 4D:
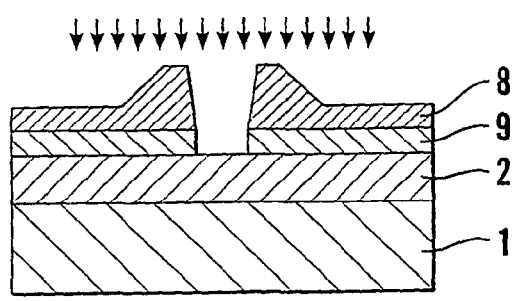
Figure 4E:
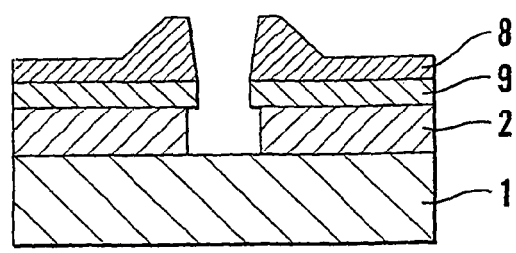

FIG. 4*c* shows the substrate following removal (etching) of the intermediate layer 9 at a part thereof that was exposed in the impression 3. Since the intermediate layer 9 consists of an aluminium layer, it is best etched away using a liquid that contains $HNO_3$, $CH_3OOH$, $H_3PO_4$ and water. FIG. 4*d* illustrates how the part of the positive resist 2 now exposed in the impression is exposed using UV radiation with a wavelength of 365 nm for 10–30 seconds. The negative resist 8 is naturally also irradiated at the same time. Due to this, cross-links are formed in the negative resist 8, meaning that this cannot be developed away in a selected, subsequent developing stage. The positive resist 2 is not cross-linked, however, but can be developed away in the parts thereof that are exposed to radiation, FIG. 4*e*. An isotropic developing method is selected here as the developing method, e.g. a developing bath comprising sodium hydroxide or tetramethyl ammonium hydroxide, which is allowed to act for up to 30 seconds. Alternatively, chemical gas etching or plasma etching in oxygen gas, which is allowed to act for around 1.5 minutes, are used. Development of the positive resist 2 takes place here both in a vertical (axial) direction and a horizontal (radial) direction, the undercut profile aspired to according to the invention being created in the coating layers, which is evident in principle from FIG. 4e. Surprisingly, it has turned out to be the case that a positive resist exposed using radiation is etched much more quickly in a plasma etching stage or chemical gas etching stage than a non-exposed positive resist is, e.g. 2–10 nm/s compared with 0.1–2 nm/s. An undercut but not too "hollowed-out" profile can thus advantageously be created in the positive resist.

Figure 5A:
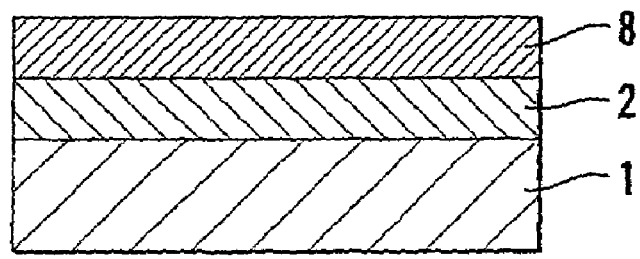
FIGS. 5a–c show a coated substrate according to a second embodiment of the invention and the stages for NIL of the same.

FIG. 5a shows a coated substrate 1 according to a second embodiment of the invention. This substrate 1 has a first coating layer 2, which consists of a positive resist, e.g. PMMA or ZEP, which is arranged in direct contact with one surface of the substrate and has a layer thickness of around 80 nm. Arranged on top of the first coating layer 2, in direct contact with the same, is a second coating layer 8, which consists of a negative resist, e.g. SC100 or SAL, and which has a layer thickness of around 80 nm.

Figure 5B:
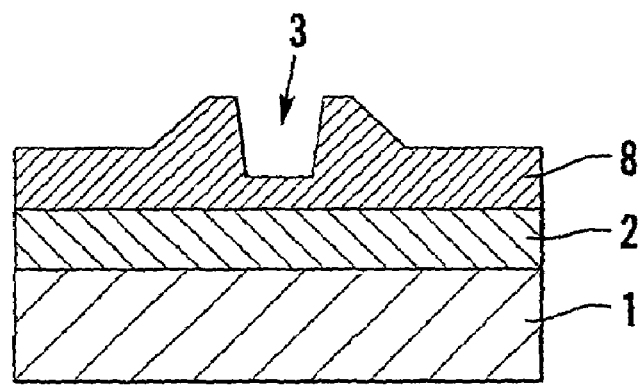

FIG. 5b shows the coated substrate following nanoimprinting at 85° C. of the second coating layer 8 (the negative resist). Here also, the first coating layer 2 has a higher glass transition temperature ($T_g$=110–117° C.) than the second coating layer 8 ($T_g$=35–55° C.). Cross-linking is also achieved in the material for the second coating layer 8 at the nanoimprint temperature, meaning that this will be developed more slowly than the first coating layer 2 in a subsequent developing stage.

Figure 5C:
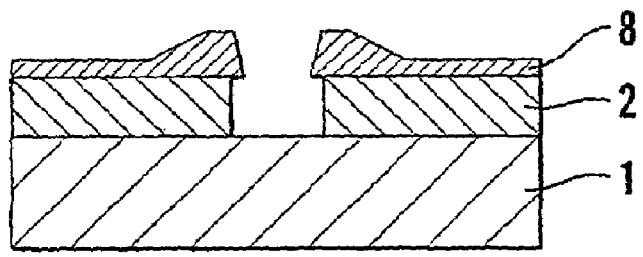

FIG. 5c shows how an undercut profile is obtained by means of isotropic plasma etching at 5.5 mbar. Thanks to the different material properties of the first and second coating layer respectively, which property differences are accentuated by the heat-induced cross-linking in the second layer 8, the developing rate for the first layer 2 will be higher than for the second layer 8 (1.5 nm/s compared with 1 nm/s). It must also be noted that in this embodiment, removal of the thin layer of the second coating layer 8 remaining in the impression 3 following imprinting is executed in the same stage as development of the first layer 2.

Figure 6A:
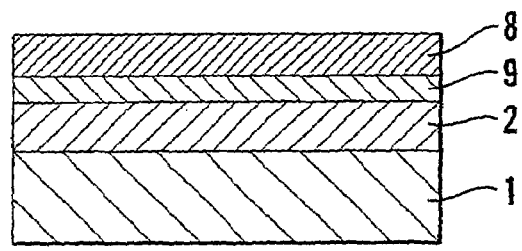
FIGS. 6a–d show a coated substrate according to a third embodiment of the invention and the stages for NIL of the same.

FIG. 6a shows a coated substrate 1 according to a third embodiment of the invention. This substrate 1 has a first coating layer 2, which consists of a positive resist, e.g. PMMA or ZEP, which is arranged in direct contact with one surface of the substrate and has a layer thickness of around 200 nm. Arranged in direct contact with the first coating layer 2 is an intermediate layer 9 (a mask) of a semiconductor material or a metal, e.g. SiO$_2$, aluminium or chromium, which has a layer thickness of around 20 nm. Arranged on top, in direct contact with the intermediate layer 9, is a second coating layer 8, which has a layer thickness of around 30–40 nm. The second coating layer 8 consists of a negative resist, e.g. SC100 or SAL.

Figure 6B:
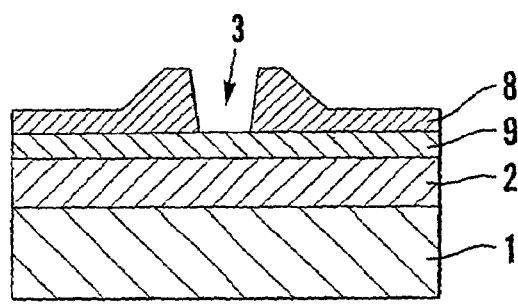

FIG. 6b shows the coated substrate following nanoimprinting at 85° C. of the second coating layer 8 (the negative resist). Here also he first coating layer 2 has a higher glass transition temperature ($T_g$=110–117° C.) than the second coating layer 8 ($T_g$=35–55° C.). Cross-linking is also achieved in the material for the second coating layer 8 at the nanoimprint temperature.

Figure 6C:
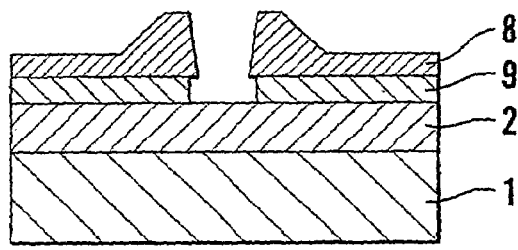
Figure 6D:
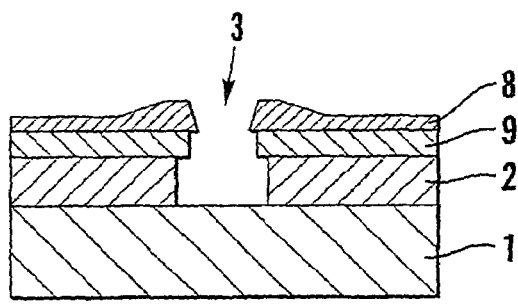

FIG. 6c shows the substrate following removal (etching) of the intermediate layer 9 at its part exposed in the impression 3. FIG. 6d shows the result following isotropic developing, plasma etching, of the positive resist 2 at its part exposed in the impression 3. As in the embodiment according to FIGS. 5a–c, the developing rate for a selected isotropic method, e.g. a wet method, is higher for the first coating layer than for the second coating layer, which leads to the desired undercut profile.

Figure 7:
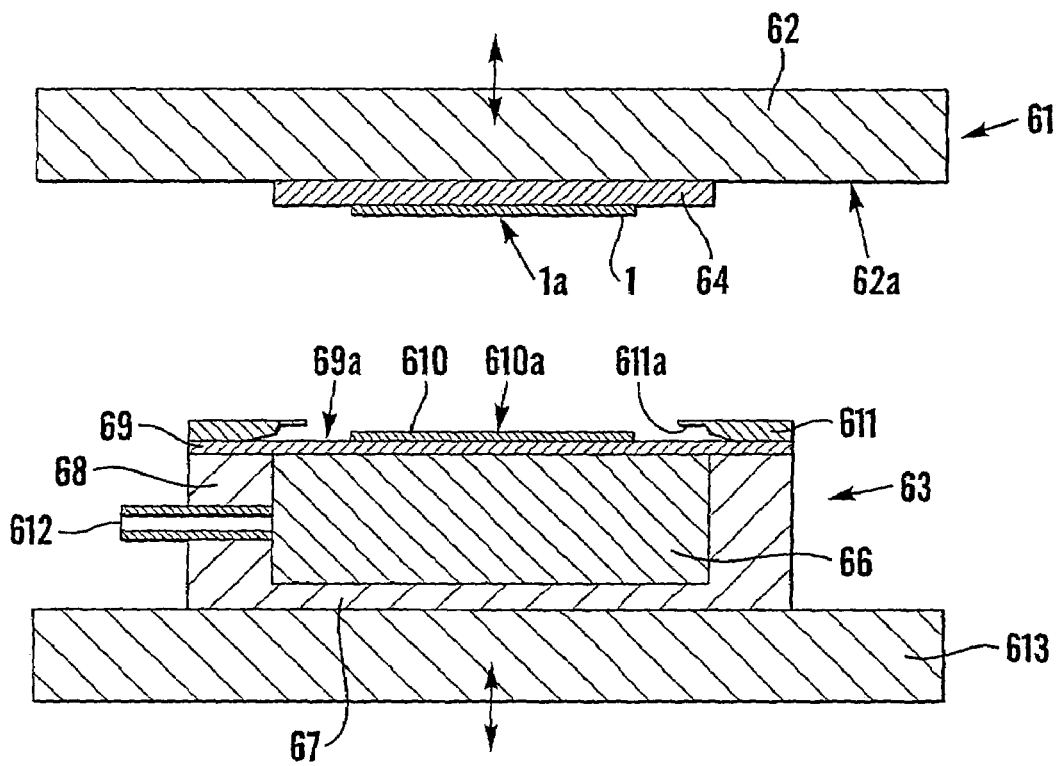
FIG. 7 shows a preferred device, seen from the side in cross-section, for execution of the imprint stage.

FIG. 7 shows a device according to SE-AO-9904517-1 for the actual imprint stage in the process according to the invention, which device is specially adapted for NIL of relatively large substrates without these needing to be provided with planarising layers. Detail number 61 in FIG. 7 represents a first main part in a preferred embodiment of such a device. This first main part 61 comprises a first principally flat base plate 62, which is preferably disposed to be displaced in a direction that coincides with the normal for its surface 62a facing a second main part 63. A principally flat bearing plate 64, on which bearing plate the coated substrate 1 is intended to be placed, can be affixed to this surface 62a. Alternatively, the substrate 1 can be placed directly onto the surface 62a. The substrate 1 is preferably circular. The main parts 61 and 63 preferably also have a rotationally symmetrical appearance.

The second main part 63 has a cavity 66, which is formed by a bottom 67 and, in the example shown, circular-cylindrical side walls 68. As a roof for the cavity 66, a flat, flexible membrane 69 is arranged opposite the bottom 67. This membrane 69 consists of a polymer material or a thin metal, preferably plastic, rubber or thin metal. One side 69a of the membrane forms a support for the template 610, and has a diameter or maximum width of 25–400 mm, preferably 50–350 mm. The membrane has a thickness of up to 10 mm, preferably up to 3 mm and even more preferredly up to 1 mm. The template 610 consists, according to the known technique for nanoimprint lithography, of a plate of e.g. metal, which is provided with a fine structural pattern, with dimensions of nanometer size, on its surface 610a facing towards the first main part 61.

The membrane 610 is fixed on the second main part 63, around the periphery of the membrane 69 at edges of the cavity 66, by means of a fixing device. A ring 611, which is circular in the example shown, is used as the fixing device, which ring is disposed to press firmly the peripheral edges of the membrane 69 between itself and the free edges of the side walls 68. Along its inner circular edge, on the side thereof that faces towards the membrane, the ring 611 is preferably bevelled 611a, to provide a soft deflection for the membrane 69 on the transition from the ring 611. The risk is hereby reduced of splits or fold notches in the membrane 69, its life being extended.

The cavity 66 is intended to accommodate a medium, which consists of a gas or liquid of low compressibility, preferably oil and even more preferredly hydraulic oil, which can be pressurized via an inlet channel 612, which can be disposed in the side walls 68 or in the bottom 67 of the cavity. Pressurization takes place by means of a pump (not shown), which is best adapted to provide a pressure with very small variations. This can be achieved e.g. by means of a proportional valve. Contained in the second main part 63 is also a second principally flat base plate 613, which forms a support for the part with the cavity 66.

At the imprint stage, the substrate 1 (including the coating layer, not shown) is heated, following which a pressure is applied in the cavity, e.g. around 5–500 bar, so that the membrane 69 flexes out The surface 610a of the template and the coated surface 1a of the substrate are thereby pressed together, against the first main part 61.

Figure 8B:
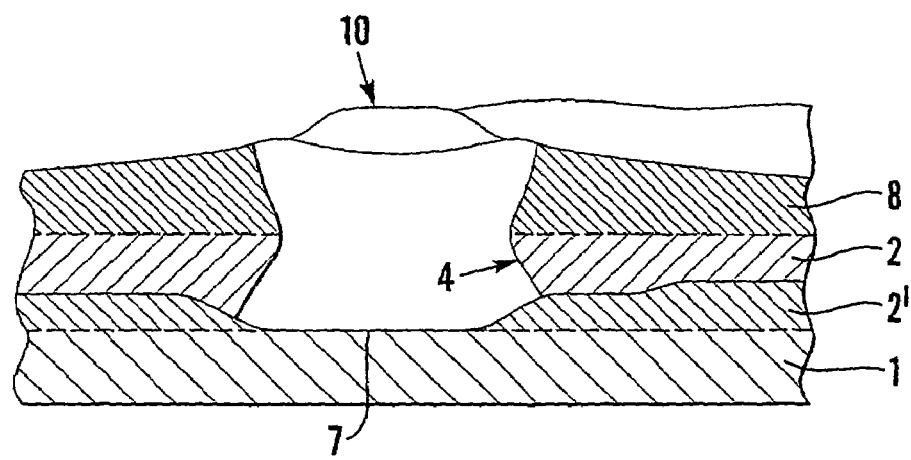
FIG. 8b shows a sketch of the substrate in FIG. 8a with reference to different parts in the same.
Figure 8A:
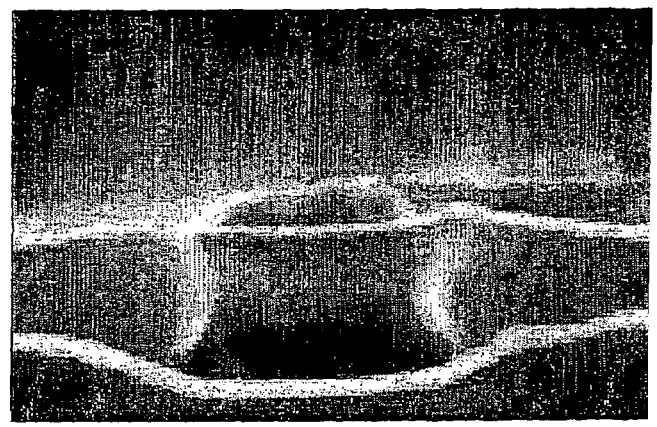
FIG. 8a shows a scanning electron microscope image of a coated, nanoimprinted and developed substrate according to the invention.

FIG. 8a, with reference numbers according to FIG. 8b, shows a substrate that has been coated, imprinted and developed according to the invention. In the scanning electron microscope image in FIG. 8a, the transition between the different coating layers 2, 8 is not visible, nor is the transition between the actual substrate 1 and the resist 2. These transitions have been drawn in using dashed lines in FIG. 8b. FIGS. 8a–b are also shown in cross-section and slightly in perspective, which has been achieved by breaking the substrate off at a hole in the same and then inclining it just a little when the SEM image was taken. It is the view in perspective and the fact that the break is not entirely clean that leads to the uneven edges between the resist 2 and detail 2'. The latter probably consists of resist residues by the break. Above the upper resist 8, an edge 10 is visible of a hole that lies further-away in the view. It is plainly evident that the desired undercut profile 4 has been achieved by means of the invention. Cf. also FIG. 3.

EXAMPLE 1

Figure 9A:
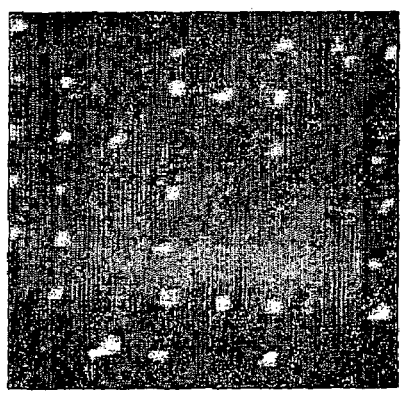
FIGS. 9a–b show scanning electron microscope images of a substrate according to the prior art, following "lift-off", a single layer of resist having been used.
Figure 9C:
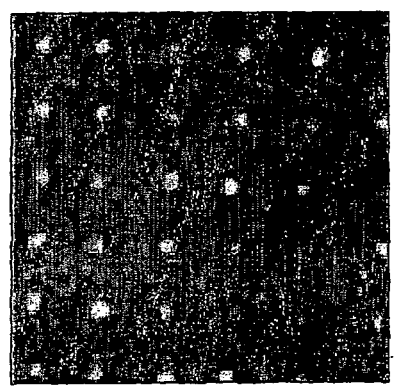
FIGS. 9c–d show scanning electron microscope images of a substrate according to the invention following "lift-off".
Figure 9B:
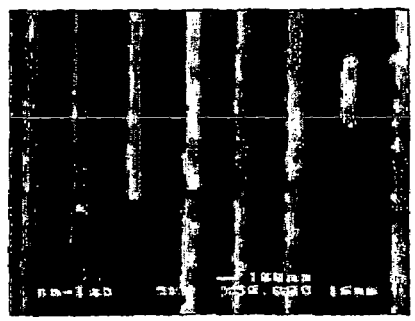
Figure 9D:
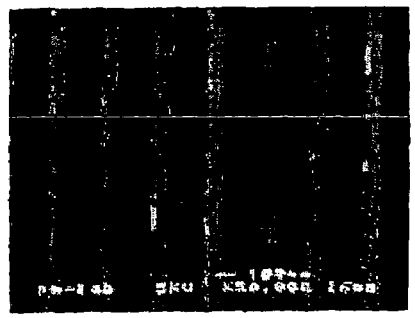

FIGS. 9*a*–*d* show a substrate that has been coated, imprinted and developed. Following developing, metallizing has been carried out, followed by lift-off. The illustrations thus show the resulting metal coating on the substrate. FIGS. 9*a*–*b* show here a substrate according to the prior art, with only one layer of resist, while FIGS. 9*c*–*d* show a substrate constructed according to the specification, FIG. 4*a*–*e*. The first coating layer consisted of 70 nm of Shipley 1800, the intermediate layer 9 consisted of 20 nm of aluminium, and the second layer 8 consisted of 130 nm of SC100. The irradiation used consisted of UV radiation with a wavelength of 265 nm for a time of 20 seconds. Developing was carried out in a bath of sodium hydroxide. As is visible in a comparison of FIGS. 9*a* and 9*c*, and 9*b* and 9*d*, the improvement in the result is considerable when the invention is used. The metal structure in FIGS. 9*a* and 9*b* has a number of voids and uneven edges, while the metal structure in FIGS. 9*c* and *d* is complete and with even edges. Another difference consisted in the fact that the lift-off process in FIGS. 9*a*–*b* took around 10 minutes in a bath during ultrasonic treatment, while the lift-off process in FIGS. 9*c*–*d* took only around 30–50 seconds in a corresponding bath. In FIGS. 9*b* and 9*d*, dimensions are indicated by a white line that corresponds to 100 nm in length.

EXAMPLE 2

Table 1 exemplifies how different resist types can be selected for the different embodiments according to FIGS. 4–6, suitable imprint temperatures also being evident. It can also be noted in this connection that the temperature is reduced to around 25° C. before the template is removed from the coated substrate.

TABLE 1

| Second layer: | SC100 | SAL |
|---|---|---|
| First layer: | 40° C. | 55° C. |
| | | |
| Shipley 1800 | A | A |
| 85° C.**) | (60–85° C.)*) | (75–85° C.) |
| PMMA | B, C | B, C |
| 117° C. | (60–117° C.) | (75–117° C.) |
| ZEP | B, C | B, C |
| 110° C. | (60–110° C.) | (75–110° C.) |

A: Embodiment according to FIG. 4
B: Embodiment according to FIG. 5
C: Embodiment according to FIG. 6
*)Nanoimprint temperature
**)$T_g$ The invention is not restricted to the embodiments shown above, but can be varied within the scope of the claims.

The invention claimed is:

1. A process in connection with nanoimprint lithography on a substrate with at least a first coating layer of a positive resist material disposed closest to a surface of the substrate, and a second coating layer of a negative resist material, the first coating layer being disposed between the substrate and the second coating layer, comprising the steps of:
   imprinting a pattern of nanometer size into the second coating layer by a template;
   exposing a portion of the first coating layer at an impression formed in the second coating layer;
   applying radiation simultaneously to the second coating layer and to only the exposed portion of the first coating layer;
   subjecting the substrate to an isotropic developing method selected so that the first coating layer is developed more quickly than the second coating layer, so that an undercut profile is obtained in the coating layers, and selected so that the exposed portion of the first coating layer which has been subjected to radiation is developed more quickly than parts of the first coating layer which have not been subjected to radiation.

2. The process according to claim 1, wherein the step of imprinting is performed at a temperature that is at least 20° C. higher than the glass transition temperature for the second coating layer.

3. The process according to claim 1, wherein said isotropic developing method consists of a method in the group that consists of plasma etching, chemical gas etching or wet methods including a developing bath, electrochemical etching or traditional film developing.

4. The process according to claim 1, wherein the first coating layer has a layer thickness of 10–400 nm, and the second coating layer has a layer thickness of 20–500 nm.

5. The process according to claim 1, wherein a third coating layer is disposed between said first and second coating layers, the third coating layer forming a mask for the first coating layer and consisting of a material in the group that consists of metals and semiconductor materials.

6. The process according to claim 5, wherein the third coating layer, in a step subsequent to imprinting and prior to applying radiation, is subjected to developing on surfaces thereof that have been exposed, for exposing the first coating layer.

7. The process according to claim 1, comprising the step of:
   developing of a thin remaining part of the second coating layer at pressed-down parts in this layer after imprinting, which developing consists of plasma etching, chemical gas etching or a wet method including a developing bath, electrochemical etching or traditional film developing.

8. The process according to claim 1, wherein said radiation consists of X-ray radiation, electron radiation, ion radiation or UV radiation.

9. The process according to claim 1, wherein the imprinting of the pattern comprises the steps of:
   placing the substrate and the template between a first surface and a second surface which first and second surfaces are opposed to one another, flat and parallel in relation to one another, wherein said second surface consists of one side of a flexible membrane;
   creating a pressure on the other side of said membrane, so that the template and the substrate are pressed together, against said first surface.

10. The process according to claim 5, wherein said group includes $SiO_2$, aluminium, chromium, gold and tungsten.

11. The process according to claim 5, wherein the third coating layer has a layer thickness of 10–40 nm.

* * * * *